(12) United States Patent
Yu

(10) Patent No.: US 6,482,703 B1
(45) Date of Patent: Nov. 19, 2002

(54) METHOD FOR FABRICATING AN ELECTROSTATIC DISCHARGE DEVICE IN A DUAL GATE OXIDE PROCESS

(75) Inventor: Ta-Lee Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/965,322

(22) Filed: Sep. 28, 2001

(51) Int. Cl.⁷ .................... H01L 21/336; H01L 21/8238
(52) U.S. Cl. .................... 438/281; 438/224; 438/231; 438/232
(58) Field of Search .................... 438/199, 224, 438/227, 248, 270, 281, 232, 231

(56) References Cited

U.S. PATENT DOCUMENTS

| | | | |
|---|---|---|---|
| 5,496,751 A | 3/1996 | Wei et al. | 437/41 |
| 5,529,941 A | 6/1996 | Huang | 437/44 |
| 5,618,740 A | 4/1997 | Huang | 438/224 |
| 5,631,485 A | 5/1997 | Wei et al. | 257/344 |
| 5,728,612 A | 3/1998 | Wei et al. | |
| 5,751,042 A * | 5/1998 | Yu | 257/360 |
| 5,837,571 A | 11/1998 | Pathak | 438/199 |
| 5,953,190 A | 9/1999 | Rees et al. | 361/56 |
| 6,114,731 A * | 9/2000 | London | 257/335 |
| 6,258,644 B1 * | 7/2001 | Rodder et al. | 438/270 |
| 6,271,999 B1 * | 8/2001 | Lee et al. | 257/567 |
| 6,396,107 B1 * | 5/2002 | Brennan et al. | 257/197 |
| 6,400,542 B1 * | 6/2002 | Lee et al. | 438/227 |

\* cited by examiner

Primary Examiner—John F. Niebling
Assistant Examiner—Walter L. Lindsay, Jr.
(74) Attorney, Agent, or Firm—George O. Saile; Stephen B. Ackerman; Stephen G. Stanton

(57) ABSTRACT

A method of fabricating an HV-I/O ESD MOS device comprising the following steps. A structure having a first device region, a second device region and an HV-I/O ESD MOS device region is provided. A gate is formed over an oxide layer within the first device region. A gate is formed over an oxide layer within the second device region. A gate is formed over an oxide layer within the HV-I/O ESD MOS device region. The first device gate oxide layer is thinner than the second device gate oxide layer and the HV-I/O ESD MOS device gate oxide layer. The gate and oxide layers within each region have exposed side walls. An LV-LDD mask is formed over the gate and the structure within the second device region. An LV-LDD implant is performed into the structure adjacent the first device gate and the HV-I/O ESD MOS device gate to form first device LV-LDD implants and HV-I/O ESD MOS device LV-LDD implants. The LV-LDD mask is removed. An HV-LDD mask is formed over the gate and the structure within the first device region. An HV-LDD implant is performed into the structure adjacent the second device gate and the HV-I/O ESD MOS device gate to form second device HV-LDD implants and HV-I/O ESD MOS device HV-LDD implants. The HV-LDD mask is removed. Spacers are formed over the respective exposed side walls of the gate and oxide layers within each respective region to complete fabrication of a first device, a second device and the HV-I/O ESD MOS device. In an alternate embodiment, an I/O LV device may also be simultaneously formed within an I/O LV device region.

42 Claims, 2 Drawing Sheets

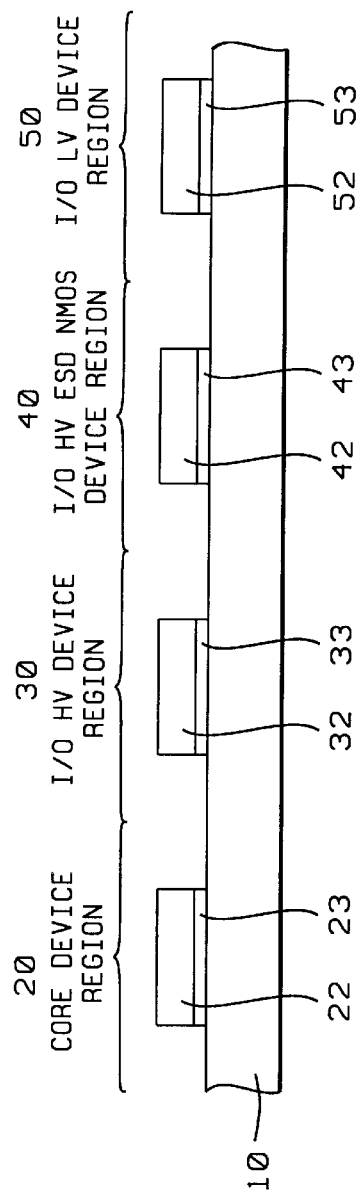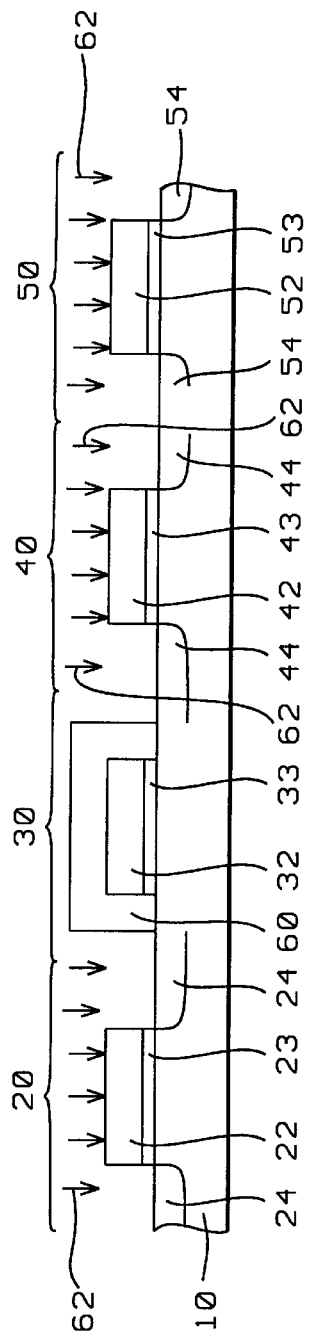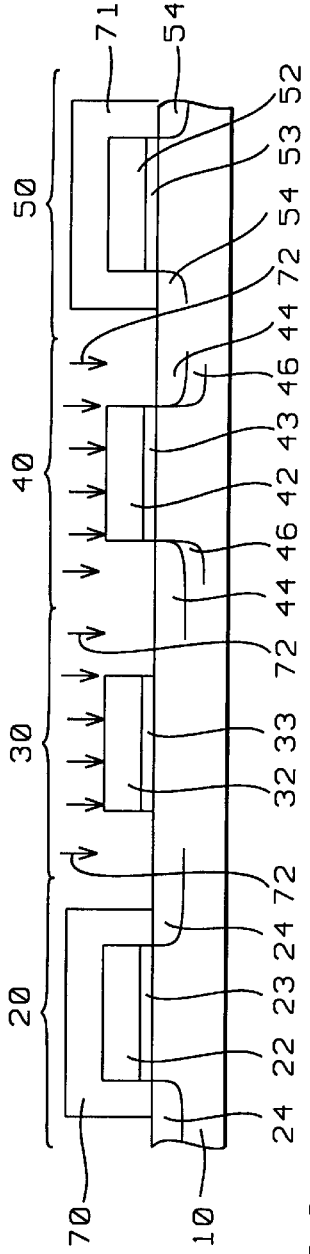

METHOD FOR FABRICATING AN ELECTROSTATIC DISCHARGE DEVICE IN A DUAL GATE OXIDE PROCESS

FIELD OF THE INVENTION

The present invention relates generally to semiconductor fabrication and more specifically to fabrication of electrostatic discharge device (ESDs).

BACKGROUND OF THE INVENTION

The current practice to optimize input/output (I/O) device electrostatic discharge device (ESD) capability is to use an additional ESD implant. Thus an additional masking step is required which increases cost.

U.S. Pat. No. 5,953,190 to Rees et al. describes an electrostatic discharge (ESD) protection circuit for an output transistor coupled to an I/O pin of an integrated circuit including a logic circuit.

U.S. Pat. No. 5,837,571 to Pathak describes a method to resolve the problem of low drain/source breakdown voltage (BVdss) in small geometry devices with thin gate oxide. One method improves the drain diffusion profile implanting through disjoint NSD/NWELL windows in the extended drain region. Other methods include building a number of side wall oxide layers, impurity compensation or oxygen implantation.

U.S. Pat. No. 5,618,740 to Huang describes a method of fabricating CMOS output buffer with enhanced ESD resistance. Core transistors are provided with punch-through pockets while the input/output transistors are not provided with punch-through pockets. The absence of pockets on the input/output transistors enhances their ESD resistance, and thus the ESD resistance of the incorporating integrated circuit.

U.S. Pat. No. 5,529,941 to Huang describes a method of fabricating an integrated circuit by fabricating: at least one functional MOSFET with a hot electron resistant structure including a lightly doped drain; fabricating at least one output MOSFET with an ESD resistant structure including a gate means without associated spacers; and electrically coupling at least one functional MOSFET to at least one output MOSFET.

U.S. Pat. No. 5,728,612 to Wei et al. describes a process for forming minimum area structures for sub-micron CMOS ESD protection in integrated circuit structures without extra implant and mask steps.

U.S. Pat. No. 5,496,751 to Wei et al. describes a method of fabricating an ESD and hot carrier resistant integrated circuit structure.

U.S. Pat. No. 5,631,485 to Wei et al. describes a an ESD and hot carrier resistant integrated circuit structure.

SUMMARY OF THE INVENTION

Accordingly, it is an object of an embodiment of the present invention to provide an improved method of fabricating electrostatic discharge devices.

Other objects will appear hereinafter.

It has now been discovered that the above and other objects of the present invention may be accomplished in the following manner. Specifically, a structure having a first device region, a second device region and an HV-I/O ESD MOS device region is provided. A gate is formed over an oxide layer within the first device region. A gate is formed over an oxide layer within the second device region. A gate is formed over an oxide layer within the HV-I/O ESD MOS device region. The first device gate oxide layer is thinner than the second device gate oxide layer and the HV-I/O ESD MOS device gate oxide layer. The gate and oxide layers within each region have exposed side walls. An LV-LDD mask is formed over the gate and the structure within the second device region. An LV-LDD implant is performed into the structure adjacent the first device gate and the HV-I/O ESD MOS device gate to form first device LV-LDD implants and HV-I/O ESD MOS device LV-LDD implants. The LV-LDD mask is removed. An HV-LDD mask is formed over the gate and the structure within the first device region. An HV-LDD implant is performed into the structure adjacent the second device gate and the HV-I/O ESD MOS device gate to form second device HV-LDD implants and HV-I/O ESD MOS device HV-LDD implants. The HV-LDD mask is removed. Spacers are formed over the respective exposed side walls of the gate and oxide layers within each respective region to complete fabrication of a first device, a second device and the HV-I/O ESD MOS device. In an alternate embodiment, an I/O LV device may also be simultaneously formed within an I/O LV device region.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 to 5 schematically illustrate a preferred embodiment of the present invention.

DETAILED DESCRIPTION OF THE PREFERRED EMBODIMENT

Figure 4:
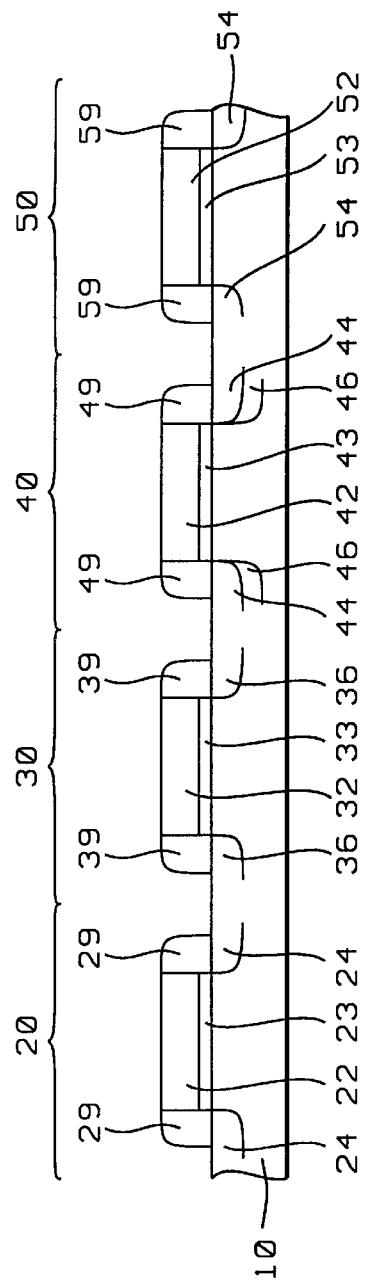

Unless otherwise specified, all structures, layers, steps, methods, etc. may be formed or accomplished by conventional steps or methods known in the prior art.

Brief Summary of the Invention

The following is a brief summary of the steps of the invention:

1. form dual oxide polysilicon gates;
2. form LV-LDD implants (As at from about 1E14 to 5E15 $cm^2$;
3. form HV-LDD implants (As or P at from about 1E12 to 1E14 $cm^2$;
4. form spacers; and
5. form source/drain regions.

Further processing may then proceed such as:
i) form ILD layer;
ii) form contact window; and
iii) metallization and passivation.

The primary devices fabricated by the method of the present invention are the HV-I/O ESD NMOS device 48 and the I/O LV device 58.

Initial Structure

As shown in FIG. 1, starting structure 10 includes: a core device region 20; an input/output (I/O) high voltage (HV) device region 30; a first optional HV-I/O electrostatic discharge (ESD) N-type metal oxide semiconductor (NMOS) device region 40; and a second optional I/O low voltage (LV) device region 50. One or both optional HV-I/O ESD NMOS device region 40 and I/O LV device region 50 may be included on structure 10, and the attendant following processing steps to form an HV-I/O ESD NMOS device 48 and an I/O LV device 58 within those respective regions 40, 50 may be completed is those respective regions 40, 50 are so included.

Structure 10 is preferably a semiconductor structure and is also understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

Gates 22, 32,42, 52 with respective underlying gate oxide 23, 33, 43, 53 are formed within the respective core device region 20, J/O HV device region 30, first optional HV-I/O ESD NMOS device region 40 and second optional I/O LV device region 50.

Core device, I/O HV device, HV-I/O ESD NMOS device and I/O LV device gates 22, 32,42, 52 are preferable from about 12 to 150 Å thick and are more preferably from about 15 to 80 Å thick. Core device gate oxide 23 is preferably from about 12 to 30 Å thick and is more preferably from about 15 to 20 Å thick and is thinner than I/O HV device, HV-I/O ESD NMOS device and I/O LV device gate oxides 33, 43, 53 which are preferably from about 40 to 150 Å thick and are more preferably from about 50 to 80 Å thick. Instead of dual gate oxide 23; 33, 43, 53 thicknesses, is also possible to have triple gate oxide thickness 23; 33, 43, 53. For triple gate oxide thicknesses, the relative gate oxide thicknesses are: about 15 Å to 20 Å to 50 Å.

Gates 22, 32, 42, 52 are preferably formed of polysilicon, tungsten (W) and other metal gate materials and are more preferably polysilicon. Gate oxides 23, 33, 43, 53 are preferably silicon oxide.

Formation of LV-LDD Implants 24,44,54

As shown in FIG. 2, low voltage-low doped drain (LV-LDD) mask 60 is formed only over I/O HV gate 32/gate oxide 33 and the adjacent structure 10 within I/O HV device region 30.

LV-LDD implant 62 is then performed into structure 10 adjacent: core device gate 22/gate oxide 23; first optional HV-I/O ESD NMOS gate 42/gate oxide 43; and second optional I/O LV device gate 52/gate oxide 53 to form: core device LV-LDD implants 24; first optional HV-I/O ESD NMOS LV-LDD implants 44; and second optional I/O LV device LV-LDD implants 54 of a depth of preferably from about 25 to 1000 Å and more preferably from about 50 to 200 Å. LV-LDD implant 62 preferably uses arsenic (As) ions at a dose of preferably from about 1E14 to 5E15 cm−2.

Formation of HV-LDD Implants 36, 46

As shown in FIG. 3, LV-LDD mask 60 is removed and high voltage-low doped drain (HV-LDD) masks 70, 71 are formed only over: core device gate 22/gate oxide 23 and the adjacent structure 10 within core device region 20; and second optional I/O LV device gate 52/gate oxide 53 and the adjacent structure 10 within I/O LV device region 50, respectively.

HV-LDD implant 72 is then performed into structure 10 adjacent: I/O HV device gate 32/gate oxide 33; and first optional HV-I/O ESD NMOS device gate 42/gate oxide 43 to form: I/O HV device HV-LDD implants 36; and first optional HV-I/O ESD NMOS HV-LDD implants 46 to a depth of preferably from about 100 to 2500 Å and more preferably from about 500 to 2000 Å. HV-LDD implant 72 preferably uses either As or phosphorus (P) ions at a dose of preferably from about 1E12 to 1E14 cm$^{-2}$.

Formation of Sidewall Spacers 29, 39, 49, 59

As shown in FIG. 4, HV-LDD masks 70, 71 are removed and sidewall spacers 29, 39, 49, 59 are formed over the exposed side walls of: core device gate 22/gate oxide 23; I/O HV device gate 32/gate oxide 33; HV-I/O ESD NMOS device gate 42/gate oxide 43; and J/O LV device gate 52/gate oxide 53 to form: core device sidewall spacers 29; I/O HV device sidewall spacers 39; HV-I/O ESD NMOS device sidewall spacers 49; and I/O LV device sidewall spacers 59. Sidewall spacers 29, 39, 49, 59 have a base width of preferably from about 200 to 2000 Å and more preferably from about 500 to 1500 Å and are preferably formed of $SiO_2$, $Si_3N_4$ or $SiO_2/Si_3N_4$ and more preferably $SiO_2$.

Formation of Source/Drain Regions 27, 37, 47, 57

Figure 5:
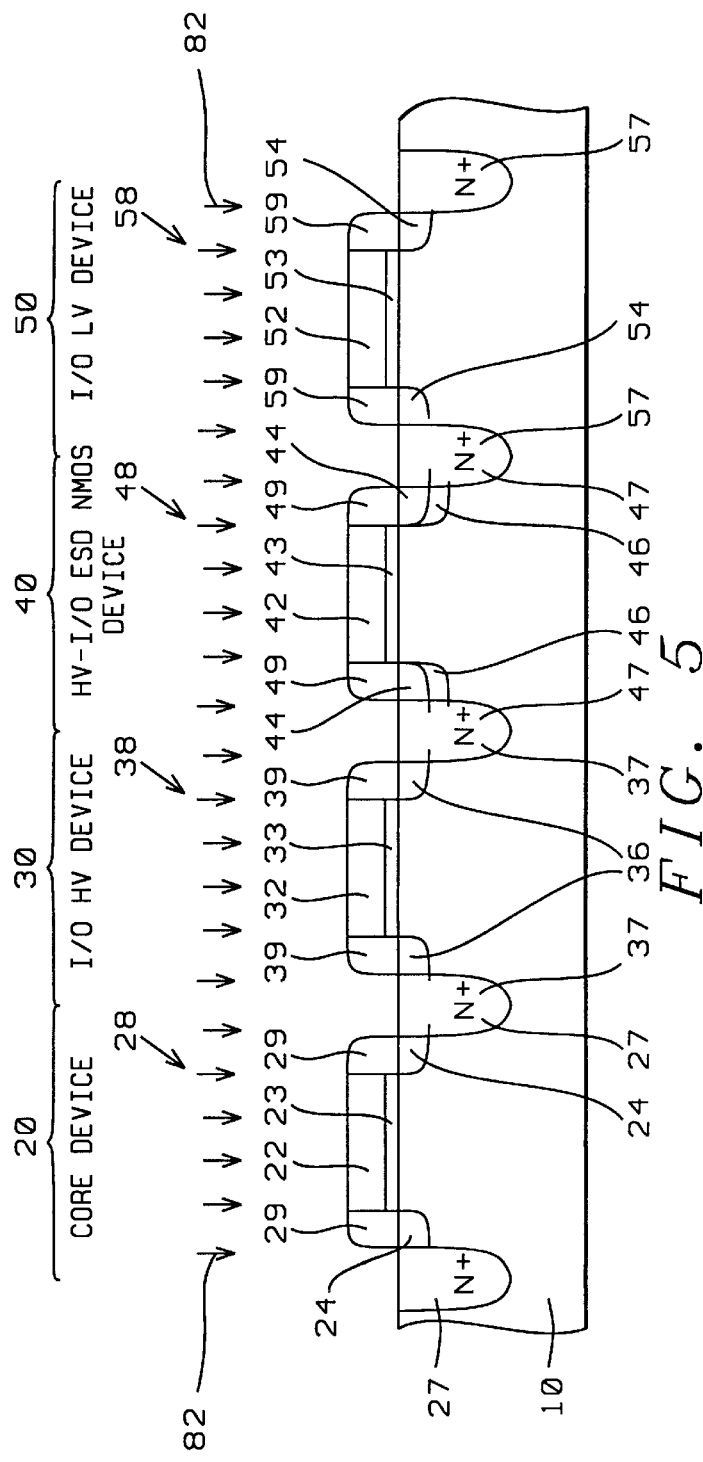

As shown in FIG. 5, N+source/drain (S/D) regions 27, 37, 47, 57 are formed within structure 10 adjacent the respective sidewall spacers 29, 39, 49, 59 to form: core device S/D regions 27; I/O HV device S/D regions 37; HV-I/O ESD NMOS device S/D regions 47; and I/O LV device S/D regions 57.

This completes the fabrication of: core device 28; I/O HV device 38; HV-I/O ESD NMOS device 48; and I/O LV device 58.

Further Processing

Although not shown, further processing may then proceed, i.e. e.g.: formation of an interlevel dielectric (ILD) layer over the devices 28, 38, 48, 58; formation of respective contact windows through the ILD layer exposing at least a portion of one or more of the devices 28, 38, 48, 58; forming and planarizing a metallization layer over the ILD layer and filling the contact windows to form respective plugs, e.g.; and passivating the structure by forming a passivation layer over the ILD layer/planarized metallization layer.

Advantages of One or More Embodiments of the Present Invention

The advantages of one or more embodiments of the present invention include:
1. compatible with dual gate CMOS processes;
2. low cost; and
3. improves ESD performance.

While particular embodiments of the present invention have been illustrated and described, it is not intended to limit the invention, except as defined by the following claims.

I claim:
1. A method of fabricating an HV-I/O ESD MOS device, comprising the steps of:
 a) providing a structure having a first device region, a second device region and an HV-I/O ESD MOS device region;
 b) forming:
  i) a first device gate oxide layer within the first device region;
  ii) a second device gate oxide layer within the I/O HV device region; and
  iii) an HV-I/O ESD MOS device gate oxide layer within the HV-I/O ESD MOS device region;
 the first device gate oxide layer being thinner than the I/O HV device gate oxide layer and the HV-I/O ESD MOS device gate oxide layer;

c) forming:
i) a first device gate upon the first device gate oxide layer;
ii) a second device gate upon the I/O HV device gate oxide layer; and
iii) an HV-I/O ESD MOS device gate upon the HV-I/O ESD MOS device gate oxide layer;
the first device gate and the first device gate oxide layer having exposed side walls, the I/O HV device gate and the I/O HV device gate oxide layer having exposed side walls, and the HV-I/O ESD MOS device gate and the HV-I/O ESD MOS device gate oxide layer having exposed side walls;
d) forming an LV-LDD mask over the I/O HV device gate and the structure within the I/O HV device region;
e) performing an LV-LDD implant into the structure adjacent the first device gate and the HV-I/O ESD MOS device gate to form first device LV-LDD implants and HV-I/O ESD MOS device LV-LDD implants;
f) removing the LV-LDD mask;
g) forming an HV-LDD mask over the first device gate and the structure within the first device region;
h) performing an HV-LDD implant into the structure adjacent the I/O HV device gate and the HV-I/O ESD MOS device gate to form I/O HV device HV-LDD implants and HV-I/O ESD MOS device HV-LDD implants;
i) removing the HV-LDD mask;
j) forming spacers over the exposed side walls of:
i) the first device gate and the first device gate oxide layer;
ii) the I/O HV device gate and the I/O HV device gate oxide layer; and
iii) the HV-I/O ESD MOS device gate and the HV-I/O ESD MOS device gate oxide layer; and
k) forming source/drain regions within the structure adjacent:
i) the first device sidewall spacers;
ii) the I/O HV device sidewall spacers; and
iii) the HV-I/O ESD MOS device sidewall spacers to complete fabrication of a first device, a second device and the HV-I/O ESD MOS device.

2. The method of claim 1, wherein the LV-LDD implant is performed using As.

3. The method of claim 1, wherein the LV-LDD implant is performed at a dosage of from about 1E14 to 5E15 cm$^{-2}$.

4. The method of claim 1, wherein the LV-LDD implant is performed using As at a dosage of from about 1E14 to 5E15 cm$^{-2}$.

5. The method of claim 1, wherein the HV-LDD implant is performed using either As or P.

6. The method of claim 1, wherein the HV-LDD implant is performed at a dosage of from about 1E12 to 1E14 cm$^{-2}$.

7. The method of claim 1, wherein the HV-LDD implant is performed using As or P at a dosage of from about 1E12 to 1E14 cm$^{-2}$.

8. The method of claim 1, wherein the first device gate oxide layer is from about 12 to 30 Å thick, the I/O HV device gate oxide layer is from about 40 to 150 Å thick and the HV-I/O ESD MOS device gate oxide layer is from about 40 to 150 Å thick.

9. The method of claim 1, wherein the first device gate is from about 12 to 150 Å thick, the I/O HV device gate is from about 12 to 150 Å thick and the HV-I/O ESD MOS device gate is from about 12 to 150 Å thick.

10. The method of claim 1, wherein the first device gate, the I/O HV gate and the HV-I/O ESD MOS gate are each formed of a material selected from the group consisting of polysilicon, tungsten and other metal gate materials.

11. The method of claim 1, wherein the first device gate, the I/O HV gate and the HV-I/O ESD MOS gate are each formed of polysilicon.

12. The method of claim 1, wherein the source/drain regions are N$^+$ source/drain regions.

13. The method of claim 1, wherein the first device is a core device; the second device is an I/O HV device; and the HV-I/O ESD MOS device is a HV-I/O ESD NMOS device.

14. A method of fabricating an HV-I/O ESD NMOS device, comprising the steps of:
a) providing a structure having a core device region, an I/O HV device region and an HV-I/O ESD NMOS device region;
b) forming:
i) a core device gate oxide layer within the core device region;
ii) an I/O HV device gate oxide layer within the I/O HV device region; and
iii) an HV-I/O ESD NMOS device gate oxide layer within the HV-I/O ESD NMOS device region;
the core device gate oxide layer being thinner than the I/O HV device gate oxide layer and the HV-I/O ESD NMOS device gate oxide layer;
c) forming:
i) a core device gate upon the core device gate oxide layer;
ii) an I/O HV device gate upon the I/O HV device gate oxide layer; and
iii) an HV-I/O ESD NMOS device gate upon the HV-I/O ESD NMOS device gate oxide layer;
the core device gate and the core device gate oxide layer having exposed side walls, the I/O HV device gate and the I/O HV device gate oxide layer having exposed side walls, and the HV-I/O ESD NMOS device gate and the HV-I/O ESD NMOS device gate oxide layer having exposed side walls;
d) forming an LV-LDD mask over the I/O HV device gate and the structure within the I/O HV device region;
e) performing an As LV-LDD implant into the structure adjacent the core device gate and the HV-I/O ESD NMOS device gate to form core device LV-LDD implants and HV-I/O ESD NMOS device LV-LDD implants;
f) removing the LV-LDD mask;
g) forming an HV-LDD mask over the core device gate and the structure within the core device region;
h) performing an As or P HV-LDD implant into the structure adjacent the I/O HV device gate and the HV-I/O ESD NMOS device gate to form I/O HV device HV-LDD implants and HV-I/O ESD NMOS device HV-LDD implants;
i) removing the HV-LDD mask;
j) forming spacers over the exposed side walls of:
i) the core device gate and the core device gate oxide layer;
ii) the I/O HV device gate and the I/O HV device gate oxide layer; and
iii) the HV-I/O ESD NMOS device gate and the HV-I/O ESD NMOS device gate oxide layer; and
k) forming source/drain regions within the structure adjacent:
i) the core device sidewall spacers;
ii) the I/O HV device sidewall spacers; and iii) the HV-I/O ESD NMOS device sidewall spacers to complete fabrication of a core device, an I/O HV device and the HV-I/O ESD NMOS device.

15. The method of claim 14, wherein the LV-LDD implant is performed at a dosage of from about 1E14 to 5E15 cm$^{-2}$.

16. The method of claim 14, wherein the HV-LDD implant is performed at a dosage of from about 1E12 to 1E14 cm$^{-2}$.

17. The method of claim 14, wherein the core device gate oxide layer is from about 15 to 20 Å thick, the I/O HV device gate oxide layer is from about 50 to 80 Å thick and the HV-I/O ESD NMOS device gate oxide layer is from about 50 to 80 Å thick.

18. The method of claim 14, wherein the core device gate is from about 15 to 80 Å thick, the I/O HV device gate is from about 15 to 80 Å thick and the HV-I/O ESD NMOS device gate is from about 15 to 80 Å thick.

19. The method of claim 14, wherein the core device gate, the I/O HV gate and the HV-I/O ESD NMOS gate are each formed of a material selected from the group consisting of polysilicon, tungsten and other metal gate materials.

20. The method of claim 14, wherein the core device gate, the I/O HV gate and the HV-I/O ESD NMOS gate are each formed of polysilicon.

21. The method of claim 14, wherein the source/drain regions are N$^+$ source/drain regions.

22. A method of fabricating an HV-I/O ESD MOS device and an I/O LV device, comprising the steps of:
   a) providing a structure having a first device region, a second device region, an HV-I/O ESD MOS device region and an I/O LV device region;
   b) forming:
      i) a first device gate oxide layer within the first device region;
      ii) a second device gate oxide layer within the I/O HV device region;
      iii) an HV-I/O ESD MOS device gate oxide layer within the HV-I/O ESD MOS device region; and
      iv) an I/O LV device gate oxide layer within the I/O LV device region;
   the first device gate oxide layer being thinner than the I/O HV device gate oxide layer, the HV-I/O ESD MOS device gate oxide layer and the I/O LV device gate oxide layer;
   c) forming:
      i) a first device gate upon the first device gate oxide layer;
      ii) a second device gate upon the I/O HV device gate oxide layer;
      iii) an HV-I/O ESD MOS device gate upon the HV-I/O ESD MOS device gate oxide layer; and
      iv) an I/O LV device gate upon the I/O LV device gate oxide layer;
   the first device gate and the first device gate oxide layer having exposed side walls, the I/O HV device gate and the I/O HV device gate oxide layer having exposed side walls, the HV-I/O ESD MOS device gate and the HV-I/O ESD MOS device gate oxide layer having exposed side walls and the I/O LV device gate and the I/O LV device gate oxide layer having exposed side walls;
   d) forming an LV-LDD mask over the I/O HV device gate and the structure within the I/O HV device region;
   e) performing an LV-LDD implant into the structure adjacent the first device gate, the HV-I/O ESD MOS device gate and the I/O LV device gate to form first device LV-LDD implants, HV-I/O ESD MOS device LV-LDD implants and I/O LV device LV-LDD implants;
   f) removing the LV-LDD mask;
   g) forming an HV-LDD mask over: the first device gate and the structure within the first device region; and the I/O LV device gate and the structure within the I/O LV device region;
   h) performing an HV-LDD implant into the structure adjacent the I/O HV device gate and the HV-I/O ESD MOS device gate to form I/O HV device HV-LDD implants and HV-I/O ESD MOS device HV-LDD implants;
   i) removing the HV-LDD mask;
   j) forming spacers over the exposed side walls of:
      i) the first device gate and the first device gate oxide layer;
      ii) the I/O HV device gate and the I/O HV device gate oxide layer;
      iii) the HV-I/O ESD MOS device gate and the HV-I/O ESD MOS device gate oxide layer; and
      iv) the I/O LV device gate and the I/O LV device gate oxide layer; and
   k) forming source/drain regions within the structure adjacent:
      i) the first device sidewall spacers;
      ii) the I/O HV device sidewall spacers;
      iii) the HV-I/O ESD MOS device sidewall spacers; and
      iv) the I/O LV device sidewall spacers;
   to complete fabrication of a first device, a second device, the HV-I/O ESD MOS device and an I/O LV device.

23. The method of claim 22, wherein the LV-LDD implant is performed using As.

24. The method of claim 22, wherein the LV-LDD implant is performed at a dosage of from about 1E14 to 5E15 cm$^{-2}$.

25. The method of claim 22, wherein the LV-LDD implant is performed using As at a dosage of from about 1E14 to 5E15 cm$^{-2}$.

26. The method of claim 22, wherein the HV-LDD implant is performed using either As or P.

27. The method of claim 22, wherein the HV-LDD implant is performed at a dosage of from about 1E12 to 1E14 cm$^{-2}$.

28. The method of claim 22, wherein the HV-LDD implant is performed using As or P at a dosage of from about 1E12 to 1E14 cm$^{-2}$.

29. The method of claim 22, wherein the first device gate oxide layer is from about 15 to 20 Å thick, the I/O HV device gate oxide layer is from about 50 to 80 Å thick, the HV-I/O ESD MOS device gate oxide layer is from about 50 to 80 Å thick and the I/O LV device gate oxide layer is from about 50 to 80 Å thick.

30. The method of claim 22, wherein the first device gate is from about 15 to 80 Å thick, the I/O HV device gate is from about 15 to 80 Å thick, the HV-I/O ESD MOS device gate is from about 15 to 80 Å thick and the I/O LV device gate is from about 15 to 80 Å thick.

31. The method of claim 22, wherein the first device gate, the I/O HV gate, the HV-I/O ESD MOS gate and the I/O LV device gate are each formed of a material selected from the group consisting of polysilicon, tungsten and other metal gate materials.

32. The method of claim 22, wherein the first device gate, the I/O HV gate, the HV-I/O ESD MOS gate and the I/O LV device gate are each formed of polysilicon.

33. The method of claim 22, wherein the source/drain regions are N$^+$ source/drain regions.

34. The method of claim 22, wherein the first device is a core device; the second device is an I/O HV device; and the HV-I/O ESD MOS device is a HV-I/O ESD NMOS device.

35. A method of fabricating an HV-I/O ESD NMOS device and an I/O LV device, comprising the steps of:

a) providing a structure having a core device region, an I/O HV device region, an HV-I/O ESD NMOS device region and an I/O LV device region;

b) forming:
  i) a core device gate oxide layer within the core device region;
  ii) an I/O HV device gate oxide layer within the I/O HV device region;
  iii) an HV-I/O ESD NMOS device gate oxide layer within the HV-I/O ESD NMOS device region; and
  iv) an I/O LV device gate oxide layer within the I/O LV device region;

the core device gate oxide layer being thinner than the J/O HV device gate oxide layer, the HV-I/O ESD NMOS device gate oxide layer and the I/O LV device gate oxide layer;

c) forming:
  i) a core device gate upon the core device gate oxide layer;
  ii) an I/O HV device gate upon the I/O HV device gate oxide layer;
  iii) an HV-I/O ESD NMOS device gate upon the HV-I/O ESD NMOS device gate oxide layer; and
  iv) an I/O LV device gate upon the I/O LV device gate oxide layer;

the core device gate and the core device gate oxide layer having exposed side walls, the I/O HV device gate and the I/O HV device gate oxide layer having exposed side walls, the HV-I/O ESD NMOS device gate and the HV-I/O ESD NMOS device gate oxide layer having exposed side walls and the I/O LV device gate and the I/O LV device gate oxide layer having exposed side walls;

d) forming an LV-LDD mask over the I/O HV device gate and the structure within the I/O HV device region;

e) performing an As LV-LDD implant into the structure adjacent the core device gate, the HV-I/O ESD NMOS device gate and the I/O LV device gate to form core device LV-LDD implants, HV-I/O ESD NMOS device LV-LDD implants and I/O LV device LV-LDD implants;

f) removing the LV-LDD mask;

g) forming an HV-LDD mask over: the core device gate and the structure within the core device region; and the I/O LV device gate and the structure within the I/O LV device region;

h) performing an As or P HV-LDD implant into the structure adjacent the I/O HV device gate and the HV-I/O ESD NMOS device gate to form I/O HV device HV-LDD implants and HV-I/O ESD NMOS device HV-LDD implants;

i) removing the HV-LDD mask;

j) forming spacers over the exposed side walls of:
  i) the core device gate and the core device gate oxide layer;
  ii) the I/O HV device gate and the I/O HV device gate oxide layer;
  iii) the HV-I/O ESD NMOS device gate and the HV-I/O ESD NMOS device gate oxide layer; and
  iv) the I/O LV device gate and the I/O LV device gate oxide layer; and k) forming source/drain regions within the structure adjacent:
  i) the core device sidewall spacers;
  ii) the I/O HV device sidewall spacers;
  iii) the HV-I/O ESD NMOS device sidewall spacers; and
  iv) the I/O LV device sidewall spacers; to complete fabrication of a core device, an I/O HV device, the HV-I/O ESD NMOS device and an I/O LV device.

36. The method of claim 35, wherein the LV-LDD implant is performed at a dosage of from about 1E14 to 5E15 cm$^{-2}$.

37. The method of claim 35, wherein the HV-LDD implant is performed at a dosage of from about 1E12 to 1E14 cm$^{-2}$.

38. The method of claim 35, wherein the core device gate oxide layer is from about 15 to 20 Å thick, the I/O HV device gate oxide layer is from about 50 to 80 Å thick, the HV-I/O ESD NMOS device gate oxide layer is from about 50 to 80 Å thick and the I/O LV device gate oxide layer is from about 50 to 80 Å thick.

39. The method of claim 35, wherein the core device gate is from about 15 to 80 Å thick, the I/O HV device gate is from about 15 to 80 Å thick, the HV-I/O ESD NMOS device gate is from about 15 to 80 Å thick and the I/O LV device gate is from about 15 to 80 Å thick.

40. The method of claim 35, wherein the core device gate, the I/O HV gate, the HV-I/O ESD NMOS gate and the I/O LV device gate are each formed of a material selected from the group consisting of polysilicon, tungsten and other metal gate materials.

41. The method of claim 35, wherein the core device gate, the I/O HV gate, the HV-I/O ESD NMOS gate and the I/O LV device gate are each formed of polysilicon.

42. The method of claim 35, wherein the source/drain regions are N$^+$ source/drain regions.

* * * * *